US007553454B2

(12) United States Patent
Yamada et al.

(10) Patent No.: US 7,553,454 B2
(45) Date of Patent: Jun. 30, 2009

(54) MICRO CHIP DEVICE

(75) Inventors: Yukio Yamada, Chofu (JP); Naoto Kakuta, Chofu (JP); Taisuke Hirono, Chofu (JP)

(73) Assignee: The University of Electro-Communications, Tokyo (JP)

( * ) Notice: Subject to any disclaimer, the term of this patent is extended or adjusted under 35 U.S.C. 154(b) by 0 days.

(21) Appl. No.: 11/751,793

(22) Filed: May 22, 2007

(65) Prior Publication Data

US 2008/0056953 A1 Mar. 6, 2008

(51) Int. Cl.
*B01L 3/00* (2006.01)
*B01L 3/02* (2006.01)
*B81B 1/00* (2006.01)

(52) U.S. Cl. ........................................ 422/100; 422/99

(58) Field of Classification Search ................. 366/340, 366/341; 422/100; 436/53; 435/13

See application file for complete search history.

(56) References Cited

U.S. PATENT DOCUMENTS 5,957,579 A * 9/1999 Kopf-Sill et al. ............ 366/340
2004/0259268 A1* 12/2004 Jacobs et al. ................ 436/180
2005/0041525 A1* 2/2005 Pugia et al. ................. 366/341

FOREIGN PATENT DOCUMENTS

WO WO 2006/065739 * 6/2006

OTHER PUBLICATIONS

Atencia Javier, et al., Controlled microfluidic interfaces, Sep. 2005, Nature, vol. 437 (29), pp. 648-655.*

* cited by examiner

*Primary Examiner*—Walter D Griffin
*Assistant Examiner*—Christine T Mui
(74) *Attorney, Agent, or Firm*—Robert F. Zielinski

(57) ABSTRACT

Buffer solution and blood are streamed in a channel of a micro chip so as to form layers. Aggregation inducing agent for aggregating platelets in blood is coated at a wall face on a buffer solution streaming side. If streaming amount of blood is increased in this state, a layer width of blood can be increased, and detail analysis between the aggregation inducing agent and the platelets is possible thereby. Even if it is necessary to take an image or a moving image for comparison between a pre-aggregation state and an aggregation state, it is sufficient to take only a portion where the aggregation inducing agent is coated, that is, a reaction portion. Then, a device can be made cheaper without two cameras or a moving mechanism for the camera or a micro chip.

15 Claims, 7 Drawing Sheets

(a)

(b)

(a)

(b)

(c)

MICRO CHIP DEVICE

BACKGROUND OF THE INVENTION

This invention relates to a micro chip device for properly controlling a reaction between specific solution and drug.

Classically, a reaction of some specific solution with some specific drug is caused in order to compare between a pre-reaction state and reaction state (see a Japanese patent application publication number of which is 2005-17254).

If a coagulant (a reagent which induces the platelet aggregation) is added to blood, for instance, it is generally known that platelets in blood and the coagulant interact, and aggregation occurs thereby. In order to quantify a degree of platelet aggregation in such a case, platelet aggregation ability should be evaluated in such a way that blood which has not yet respond to the coagulant is adopted for a reference, and aggregation which occurs by reaction between the blood and the coagulant is measured and is compared with the reference. In the past, a device for executing aggregation reaction in a micro channel in the micro chip in order to measure the platelet aggregation ability has been proposed. For example, at least two channels wherein blood flows are formed in the micro chip, and coagulant is coated in one channel so that blood and coagulant can interact, and coagulant is not coated in the other channel so as to watch pre-aggregation state of the blood. It is necessary to observe simultaneously with comparing two channels in such a device.

In such a device having two channels, it may be necessary to take images or sequential images (moving images) of the respective channels for comparison between a reaction state and a pre-reaction state. One option for doing so is to arrange one camera for each channel, and the other option is to arrange only one camera and to make the camera or the micro chip movable. In any case, defects are that the structure is complex and the device is rather expensive. Especially, in the second option, some mechanism for moving the camera or the micro chip is necessary, and troubles on the operation are anticipated.

When excessive solution flows into the channel wherein drug is coated, proper reaction state may not be obtained. If excessive blood flows into the channel wherein the coagulant is coated for instance, it is difficult to quantify due to clogging of the channel with platelets aggregated at one time.

The object of the invention is to provide a micro chip device for solving the above-mentioned problem.

SUMMARY OF THE INVENTION

One aspect of the invention is a micro chip device, comprising:

- a first channel wherein first solution flows;
- a second channel wherein second solution flows;
- a third channel connected with a downstream of said first and second channels wherein said first and second solutions flow, forming layers;
- first solution supply means for controlling supply amount of said first solution;
- second solution supply means for controlling supply amount of said second solution; and
- a reaction portion located at said third channel which does not react to said first solution but reacts to said second solution.

And, another aspect of the invention is the micro chip device, wherein an interface between said first and second solutions moves in said third channel on the basis of a control of supply amount of said first solution by said first solution supply means and a control of supply amount of said second solution by said second solution supply means.

And, another aspect of the invention is the micro chip device, wherein said reaction portion is located at a wall face which contacts with said moving interface.

And, another aspect of the invention is the micro chip device, wherein sections of said first through third channels have almost rectangular shapes.

Besides, another aspect of the invention is the micro chip device, wherein said reaction portion is an area where drug which does not react to said first solution but reacts to said second solution is coated.

According to these aspects of the invention, both states, the state where the second solution does not respond to the reaction portion and the state where the second solution starts to respond to the reaction portion, can be switched by controlling respective layer widths of the first and second solutions in the third channel with both the first and second solutions supply means. Then, both states, the state where the second solution does not respond to the reaction portion and the state where the second solution starts to respond to the reaction portion, can be watched at the same portion, and detail analysis is possible thereby in comparison with a case of watching at different portions. And, it is sufficient to take only a reaction portion and is not necessary to provide two cameras or a moving mechanism for the camera or a micro chip even if an image or a moving image is necessary to be taken for comparison between a pre-reaction state and a reaction state. For this reason, the device can be made cheaper.

Furthermore, another aspect of the invention is the micro chip device, wherein said first solution is buffer solution, and said second solution is blood, and said drug is aggregation inducing agent for aggregating platelets in said blood.

According to this aspect of the invention, it is possible to watch a pre-aggregation state of platelets and a way of aggregating platelets, so that detail analysis, such as an analysis how to change a size, an area or volume of lump aggregation with time, is possible. Even if an image or a moving image is necessary to be taken for comparison between an aggregation state and a pre-aggregation state, it is sufficient to take only a portion on which the aggregation inducing agent is coated (that is, the reaction portion) without arranging two cameras and without a moving mechanism of a camera or a micro chip, and a stabilization at the time of operations can be improved and the device can be made cheaper due to its simplified structure.

BEST MODE FOR EXECUTING THE INVENTION

The invention utilizes a characteristic of fluid flowing in a micro channel of a micro chip, the characteristic wherein if two kinds of solutions or more are streamed in a micro section of channel, these solutions flow without mixing with each other, forming layers, due to very low Reynolds number. Concretely speaking, the first and second solutions are streamed in a micro channel so as to form layers, a reaction portion which reacts to only the second solution is located at a predetermined area, so that the reaction state between the second solution and the reaction portion can be fine controlled in the area where the reaction is located by changing the layer widths of the first and second solutions.

DESCRIPTION OF THE PREFERRED EMBODIMENTS

Figure 1:
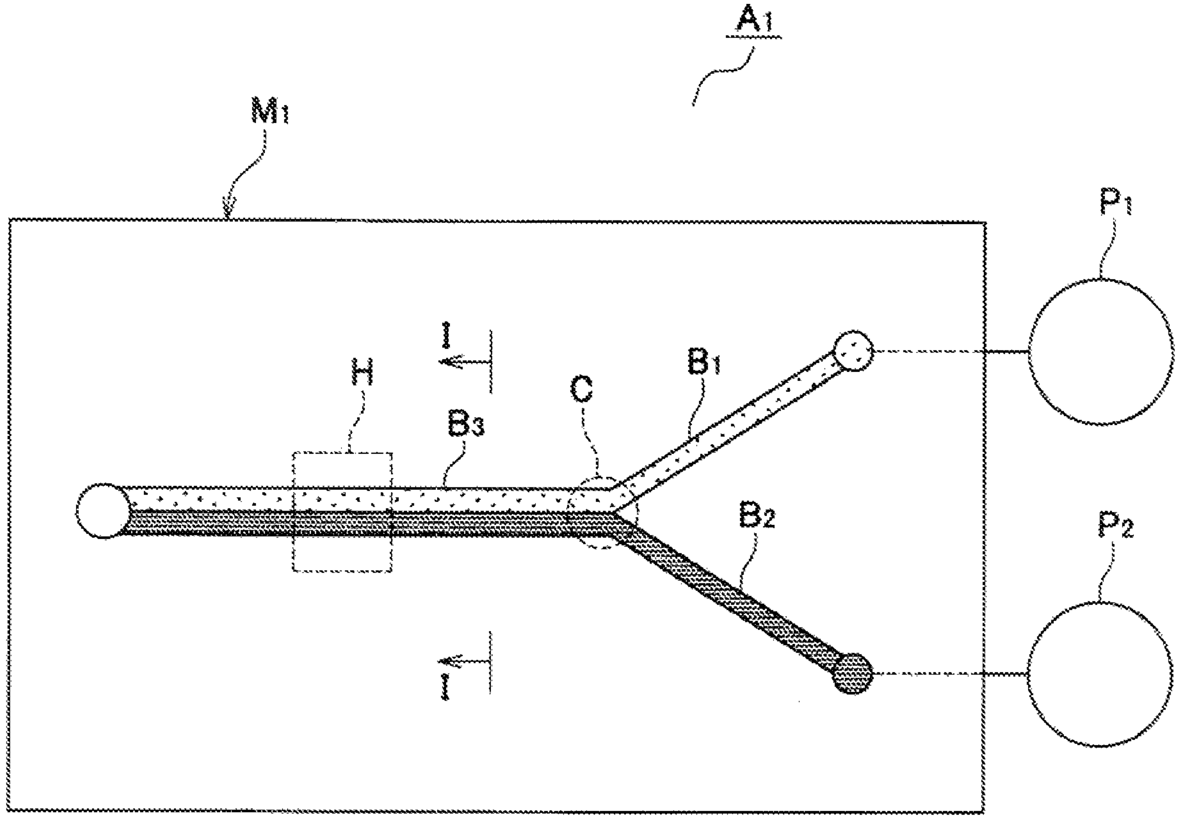
FIG. 1 is a top view for explaining one instance of the whole structure of a micro chip device according to the invention.
Figure 2:
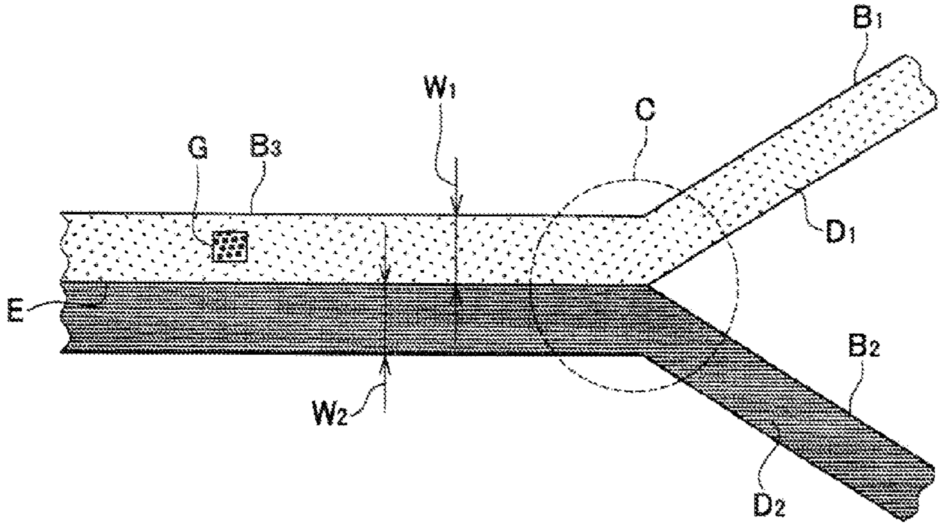
FIG. 2 is an enlarged view of a state of a periphery of a meeting portion of FIG. 1.
Figure 2:
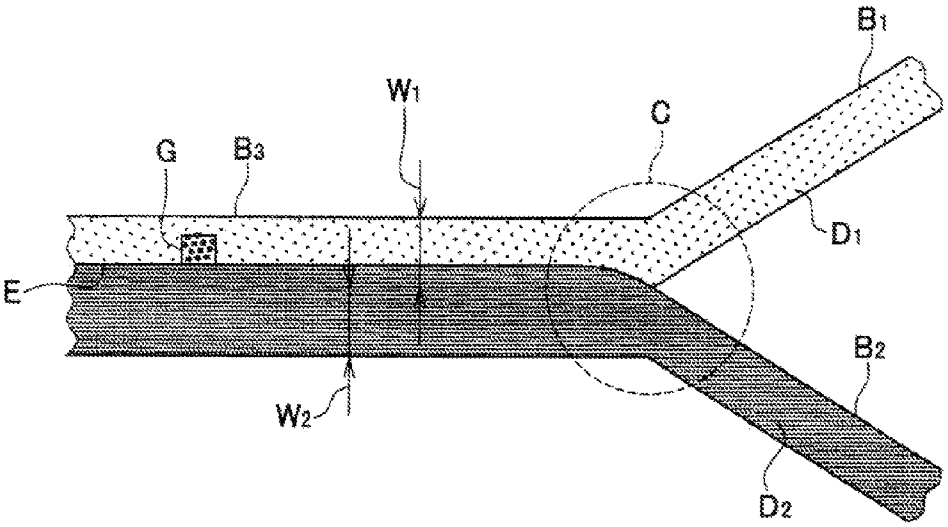
Figure 3:
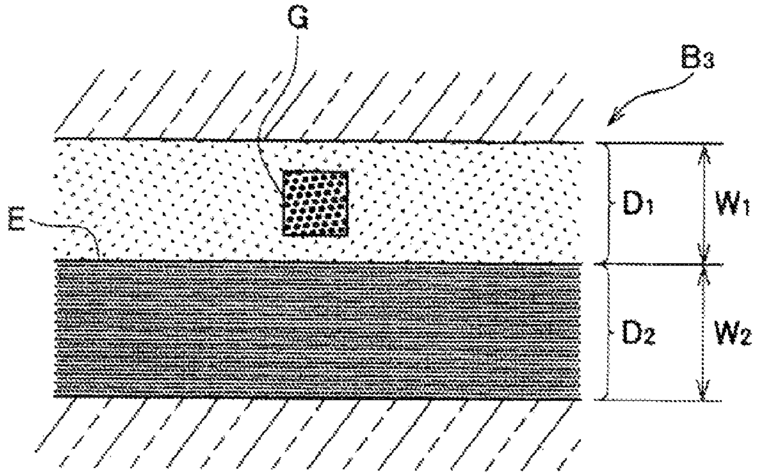
FIG. 3 is an enlarged top view showing a H portion of FIG. 1.
Figure 3:
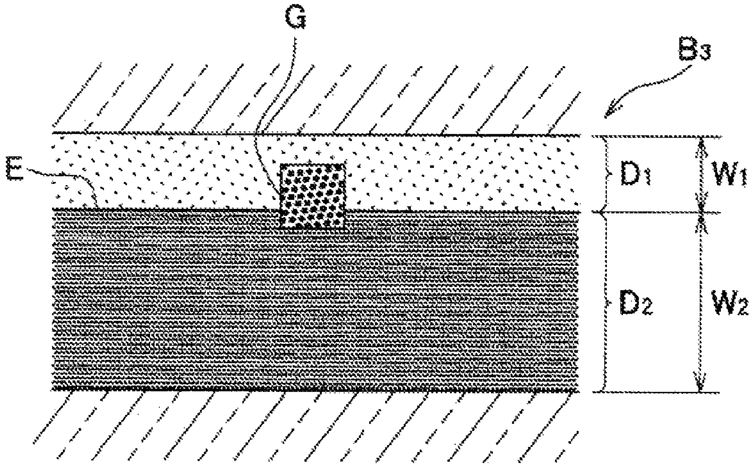
Figure 3:
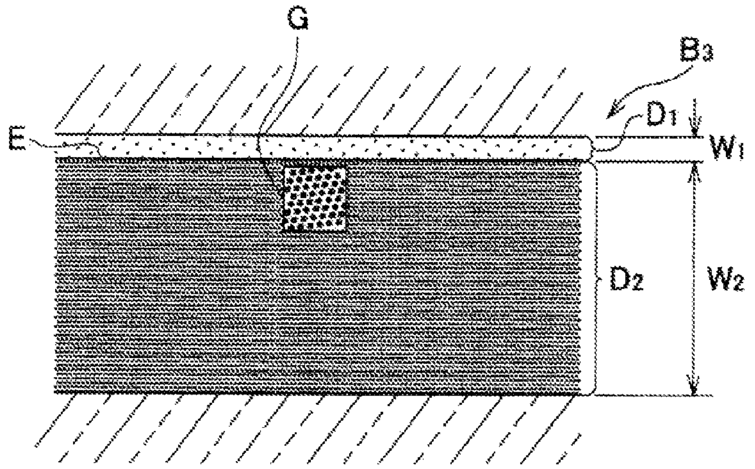
Figure 4:
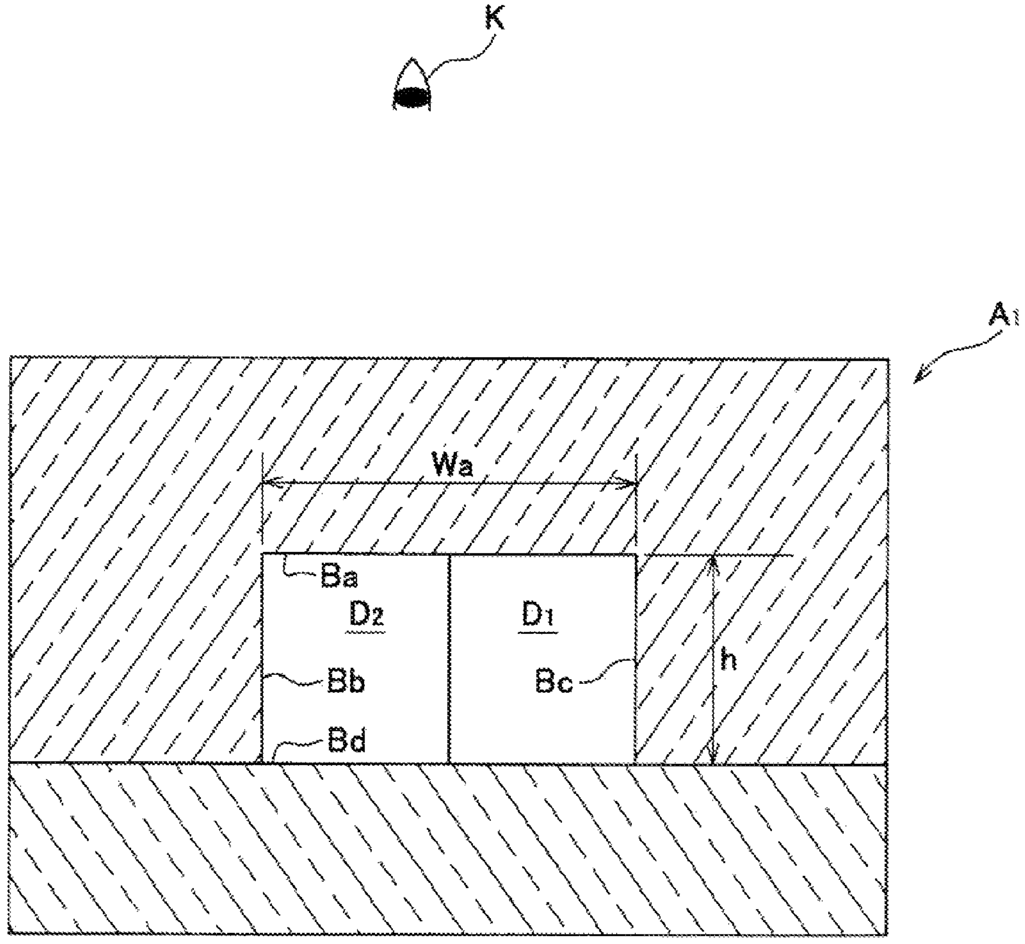
FIG. 4 is a sectional view taken as indicated by line I-I of FIG. 1.

The best mode of embodiment for executing the invention is now explained, referring to the appended FIGS. 1 through 4. FIG. 1 is a top view for explaining one instance of the whole structure of a micro chip device according to the invention, FIG. 2 is an enlarged view of a state of a periphery of a meeting portion of FIG. 1, FIG. 3 is an enlarged top view showing a H portion of FIG. 1, and FIG. 4 is a sectional view taken as indicated by line I-I of FIG. 1.

A micro chip device $A_1$ according to the invention has a chip body $M_1$ which is comprised of a first channel $B_1$ wherein first solution (denoted by $D_1$ of FIG. 2) flows and a second channel $B_2$ wherein second solution (denoted by $D_2$ of FIG. 2) flows, as shown in FIG. 1 and FIG. 2. Both channels $B_1$ and $B_2$ are located so as to meet with each other at a downstream side ("the meeting portion" hereinafter denoted by C) of both channels, and a third channel $B_3$ is connected with both channels $B_1$ and $B_2$ at the downstream thereof. The first solution $D_1$ which is supplied from the first channel $B_1$ to the third channel $B_3$ and the second solution $D_2$ which is supplied from the second channel $B_2$ to the third channel $B_3$ respectively flow, forming two layers without mixing with each other due to micro sections of the channels $B_1$, $B_2$ and $B_3$. A reaction portion G which reacts to only second solution $D_2$ and does not react to the first solution $D_1$ is arranged in the third channel $B_3$ (see G of FIGS. 2(*a*) and (*b*)).

In this embodiment, supply amount of the first solution $D_1$ is controlled by first solution supply means and supply amount of the second solution $D_2$ is controlled by a second solution supply means. Respective layer widths $W_1$ and $W_2$ in FIG. 2(*a*) of the solutions $D_1$ and $D_2$ in the third channel $B_3$ depend on amount of flow, pump pressure or viscosity thereof, and are controlled on the basis of a control of the supply amount of the first solution $D_1$ by the first solution supply means and a control of the supply amount of the second solution $D_2$ by the second solution supply means. According to both controls, an interface E (see FIG. 2(*a*), (*b*)) between the first solution $D_1$ and the second solution $D_2$ in the third channel $B_3$ moves. FIG. 2(*a*) shows such a state that the interface E is at an almost center, and FIG. 2(*b*) shows a state of the interface E moved upward. This movement of the interface E induces a state as shown in FIG. 3(*a*) wherein the reaction portion G contacts with only first solution $D_1$ and does not contact with the second solution $D_2$, a state as shown in FIG. 3(*b*) wherein the second solution $D_2$ starts to contact with the reaction portion G, and a state as shown in FIG. 3(*c*) wherein all reaction portion G contacts with the second solution $D_2$.

Figure 6:
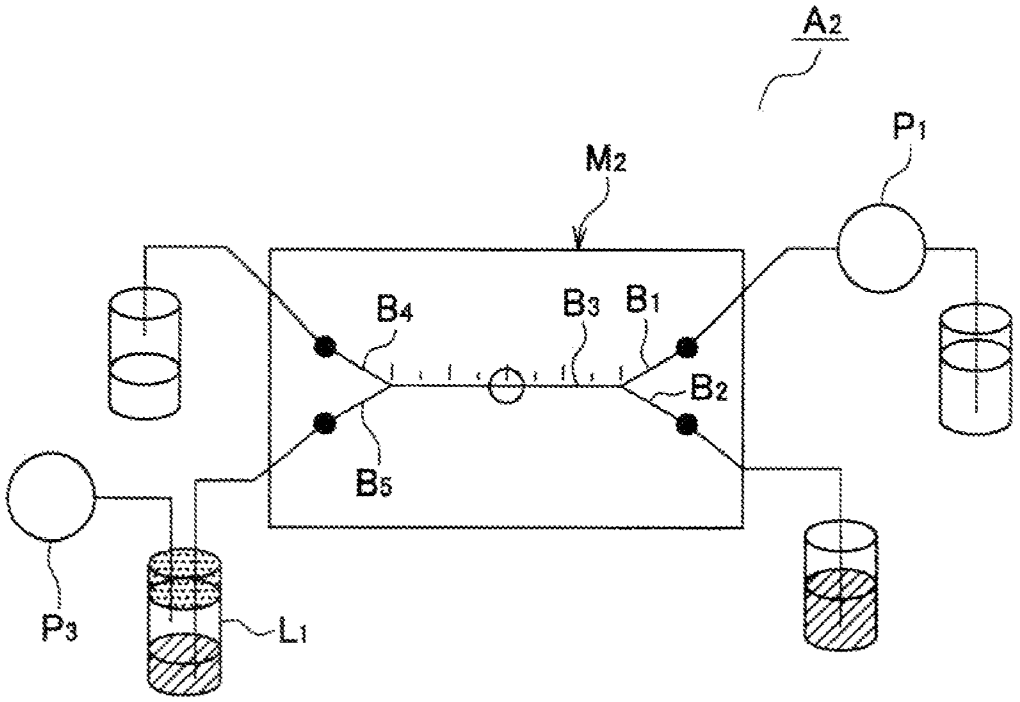
FIG. 6 is a top view for explaining another instance of the whole structure of the micro chip device according to the invention.
Figure 7:
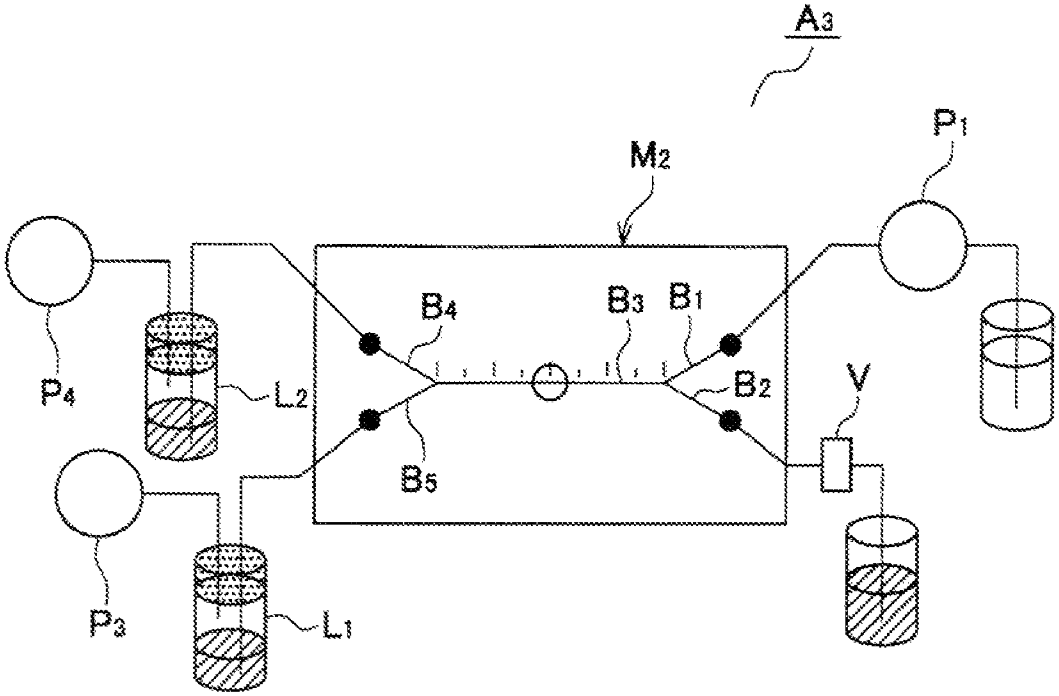
FIG. 7 is a top view for explaining another instance of the whole structure of the micro chip device according to the invention.

The solution supply means for controlling the layer widths $W_1$ and $W_2$ of the first and second solutions $D_1$ and $D_2$ may be a pressure pump $P_1$ of FIG. 1 which is located at the first channel $B_1$ and a pressure pump $P_2$ of FIG. 1 which is located at the second channel $B_2$, or may be ones as shown in FIG. 6. That is, the downstream of the third channel $B_3$ may be branched into a fourth channel $B_4$ which is located on a side where the first solution $D_1$ flows and a fifth channel $B_5$ which is located on a side where the second solution $D_2$ flows, and the pressure pump $P_1$ as the first solution supply means may be located at the first channel $B_1$ and a first withdrawal pump $P_3$ as the second solution supply means may be located at the fifth channels $B_5$. Furthermore, the pressure pump $P_2$ (see FIG. 1) as the second solution supply means may be located at the second channel $B_2$ and a second withdrawal pump (not shown) as the first solution supply means may be located at the forth channels $B_4$. Otherwise, the pressure pump $P_1$ as the first solution supply means may be located at the first channel $B_1$, and the first withdrawal pump $P_3$ as the second solution supply means may be located at the fifth channel $B_5$, and a second withdrawal pump $P_4$ as the first solution supply means may be located at the forth channel $B_4$, as shown in FIG. 7.

According to the invention, a person can watch both states, the state as shown in FIG. 3(*a*) wherein the second solution $D_2$ does not react to the reaction portion G, and the state as shown in FIGS. 3(*b*) and (*c*) wherein the second solution $D_2$ is reacting to the reaction portion G at the same portion, so that detail analysis is possible in comparison with a case of watching at different portions. Even if an image or a moving image is necessary to be taken for comparison between a reaction state and a pre-reaction state, it is sufficient to take only the reaction portion G without arranging two cameras and without a moving mechanism of a camera or a micro chip (that is, the above-mentioned chip body), and a stabilization on operations can be improved and the device can be made cheaper due to its simplified structure.

Preferably, the reaction portion G is located at a wail face which contacts with the moving interface E.

Preferably, the sections of the first through third channels $B_1$ through $B_3$ respectively have rectangular shapes (the width and the height may be tens of μm through hundreds of μm or so) as shown in FIG. 4, and the reaction portion G is located at the wall face of the third channel $B_3$ (Preferably, the wall face is a moving one, contacting with the interface E and includes a wall face Ba close to an observer K and a wall face Bd far from an observer K).

Besides, the reaction portion G may be an area coating drug thereon which does not react to the first solution $D_1$ but reacts to only the second solution $D_2$.

The first solution $D_1$ may be buffer solution, and the second solution $D_2$ may be blood, and the drug may be aggregation inducing agent for aggregating platelets in the blood. Then, it is possible to watch a pre-aggregation state of platelets and a way of aggregating platelets, so that detail analysis, such as an analysis how to change a size, an area or volume of lump aggregation with time, is possible. Even if an image or a moving image is necessary to be taken for comparison between an aggregation state and a pre-aggregation state, it is sufficient to take only a portion on which the aggregation inducing agent is coated (that is, the reaction portion G) without arranging two cameras and without a moving mechanism of a camera or a micro chip, and a stabilization at the time of operations can be improved and the device can be made cheaper due to its simplified structure.

First Embodiment

In this embodiment, the micro chip device $A_1$ as shown in FIG. 1 was made. $B_1$ in the figure denotes the first channel wherein buffer solution (the first solution $D_1$ of FIG. 2) flows, and $B_2$ denotes the second channel wherein blood (the second solution $D_2$ of FIG. 2) flows, and $B_3$ denotes the third channel connected with the downstream of these channels. These three channels $B_1$ through $B_3$ are arranged in the shape of a Y character. The first pressure pump $P_1$ (the first solution supply means) for supplying the buffer solution $D_1$ is connected with the upstream of the first channel $B_1$, and the second pressure pump $P_2$ (the second solution supply means) for supplying the blood $D_2$ is connected with the upstream of the second channel $B_2$.

These three channels $B_1$ through $B_3$ respectively have rectangular shapes in their sections as shown in FIG. 4, each width Wa of the first and second channels $B_1$, $B_2$ is 100 μm and each height h of both is 50 μm, and the width Wa of the third channel $B_3$ is 200 μm and the height h is 50 μm.

A water-soluble polymer derived from 2-methacryloyloxy ethyl phosphorylcholine (MPC) is a compound, which has the similar structure as the polar group of phospholipid in cell membrance.

Various Materials

Nonabsorptive substance can be obtained with using MPC, which does not absorb protein, such as a product manufactured by AI BIO-CHIPS Co., Ltd. under the name of "PC-modifier-PDMS", is coated on the upper wall face Ba and side wall faces Bb, Bc, and nonabsorptive substance, such as a product manufactured by AI BIO-CHIPS under the name of "PC-modifier-C", is coated on the lower wall face Bd. In this embodiment, the blood $D_2$ supplied from the first channel $B_1$ to the third channel $B_3$ and the buffer solution $D_1$ supplied from the second channel $B_2$ to the third channel $B_3$ flow, forming layers without mixing with each other.

Figure 5:
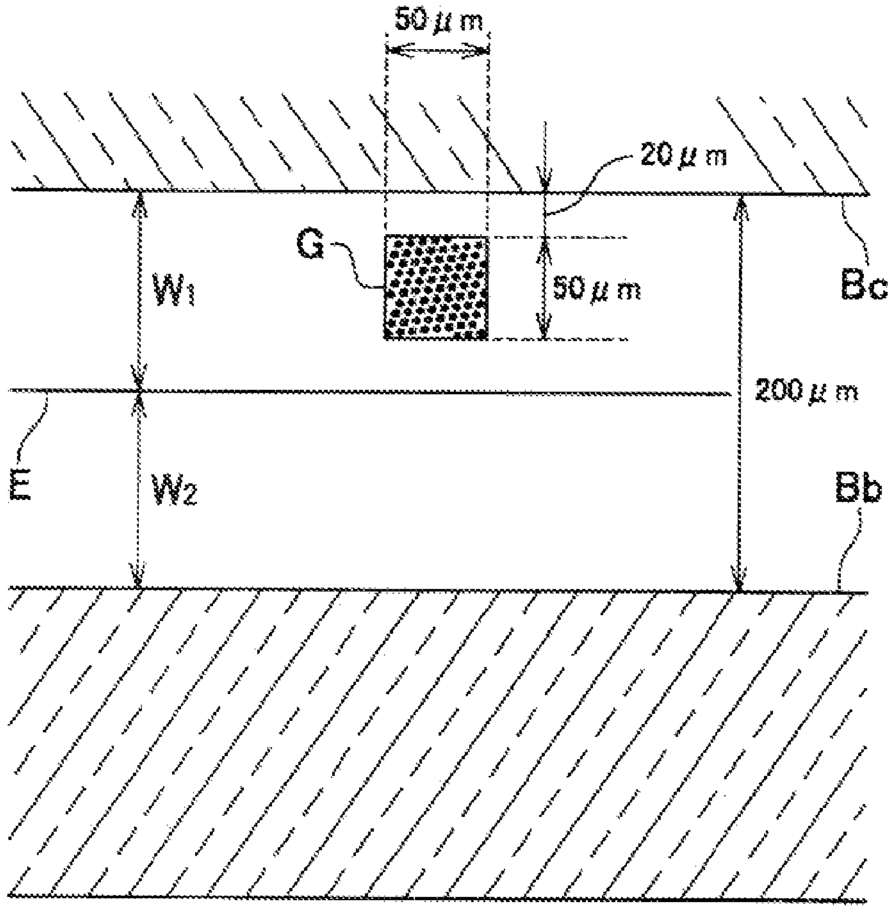
FIG. 5 is a sectional view showing an instance of location of a reaction portion G.

And, substance having affinity for living body is coated in advance on a 50 μm×50 μm square area denoted by G of FIG. 5 which is 20 μm far from the side wall face Bc on the lower wall face Bd of the center portion of the third channel $B_3$, and thereafter the aggregation inducing agent is coated thereon.

If the supply amount of the blood $D_2$ and the supply amount of the buffer solution $D_1$ are made almost equal by adjusting the first and second pressure pumps $P_1$ and $P_2$, the layer width $W_1$ of the blood $D_2$ and the layer width $W_2$ of the buffer solution $D_1$ in the third channel $D_3$ are almost made equal as shown in FIG. 2(*a*) and FIG. 3(*a*), and the aggregation inducing agent G does not contact with the blood $D_2$, but contacts only the buffer solution $D_1$. Therefore, no reaction occurs between the blood $D_2$ and the aggregation inducing agent G. But, so-called spontaneous platelet aggregation wherein platelets aggregate even if aggregation inducing agent is not added can be watched, depending on a characteristic or a state of a blood sample since rate of flow is higher as a distance from the wall face becomes longer and shear stress is applied on blood sample.

If the supply amount of the buffer solution $D_1$ is decreased and the supply amount of the blood $D_2$ is increased in the afore-mentioned state, the interface E ascends as shown in FIG. 3(*b*), and a part of the aggregation inducing agent G starts to contact with the blood $D_2$ and a small amount of aggregation starts to occur.

If the supply amount of the blood $D_2$ is further increased, the state changes as shown in FIG. 3(*c*) and all face of the aggregation inducing agent G contacts with the blood $D_2$. Then, the aggregation reaction becomes stronger.

Second Embodiment

In this embodiment, a micro chip device $A_2$ as shown in FIG. 6 was made. $M_2$ in FIG. 6 denotes a chip body, $B_1$ in FIG. 6 denotes the first channel wherein buffer solution (the first solution $D_1$ of FIG. 2) flows, and $B_2$ denotes the second channel wherein blood $D_2$ (the second solution of FIG. 2) flows, and $B_3$ denotes the third channel connected with the downstream of these channels. And, the downstream of the third channel $B_3$ may be branched into the fourth channel $B_4$ which is located on a side where the buffer solution $D_1$ (upper side in the figure) flows and the fifth channel $B_5$ which is located on a side where the blood $D_2$ flows (lower side in the figure), and the pressure pump $P_1$ as the first solution supply means is located at the first channel $B_1$ and the first withdrawal pump $P_3$ as the second solution supply means is located at the fifth channel $B_5$ through a sealed container $L_1$. When air in the sealed container $L_1$ is sucked by the first withdrawal pump $P_3$, the solution flows from the fifth channel $B_5$ into the sealed container so as to be pooled in the container. With such a structure, the blood $D_2$ itself does not flow inside the first withdrawal pump $P_3$, so that there is no clogging with blood cells in a movable portion inside the pump. As the result, it is possible to avoid a trouble, a damage, a breakdown of the pump.

These five channels $B_1$ through $B_5$ respectively have rectangular shapes in their sections as shown in FIG. 4, the width Wa of the third channel $B_3$ is 200 μm and the height h thereof is 50 μm. In the other channels, the width Wa is 100 μm and the height h is 50 μm. Nonabsorptive substance which does not absorb protein, such as a product manufactured by AI BIO-CHIPS Co., Ltd. under the name of "PC-modifier-PDMS", is coated on the upper wall face Ba and side wall faces Bb, Bc of each channel, and nonabsorptive substance, such as a product manufactured by AI BIO-CHIPS Co., Ltd. under the name of "PC-modifier-C", is coated on the lower wall face Bd.

And, substance having affinity for living body is coated in advance on a 50 μm×50 μm square area denoted by G in FIG. 5 which is 20 μm far from the side wall Bc on the lower wall Bd of the center portion of the third channel $B_3$, and thereafter the aggregation inducing agent is coated thereon.

When the pressure pump $P_1$ is firstly operated in such a device, the first channel $B_1$, the third channel $B_3$, the fourth channel $B_4$ and the fifth channel $B_5$ are filled with the buffer solution $D_1$. When the first withdrawal pump $P_3$ is operated in the afore-mentioned state, the suction force acts even in the blood $D_2$ in the second channel $B_2$ through air in the sealed container $L_1$→the buffer solution $D_1$ in the fifth channel $B_5$→the buffer solution $D_1$ in the third channel $B_3$. As the result, the buffer solution $D_1$ in the fifth channel $B_5$ and the buffer solution $D_1$ in the third channel $B_3$ are ejected into the container $L_1$. With this ejection, the blood $D_2$ is supplied from the second channel $B_2$ to the third channel $B_3$, and flows so as to form a layer. Thereafter, the blood $D_2$ is ejected from the fifth channel $B_5$ into the container $L_1$. The layer width $W_1$ of the buffer solution $D_1$ and the layer width $W_2$ of the blood $D_2$ can be changed by adjusting pressurized amount of the buffer solution $D_1$ by the pressure pump $P_1$ and suction amount of the blood $D_2$ by the first withdrawal pump $P_3$. Preferably, the pressurized amount of the pressure pump $P_1$ may be gradually decreased with constant suction amount with the first withdrawal pump $P_3$.

Third Embodiment

In this embodiment, a micro chip device $A_3$ as shown in FIG. 7 was made. The chip body $M_2$ the same as one of the second embodiment is used, and a valve V for controlling supply of blood is located at the second channel $B_2$, and the second withdrawal pump $P_4$ as the first solution supply means is connected with the fourth channel $B_4$ through a sealed container $L_2$. Similar to the second embodiment, the pressure pump (the first solution supply means) $P_1$ is connected with the first channel $B_1$, and the sealed container $L_1$ and the first withdrawal pump (second solution supply means) $P_3$ are connected with the fifth channel $B_5$.

If the valve V is closed and the respective withdrawal pumps $P_3$ and $P_4$ are stopped and only the pressure pump $P_1$ is operated in such a device, the first channel $B_1$, the third channel $B_3$, the fourth channel $B_4$ and the fifth channel $B_5$ are filled with the buffer solution $D_1$, similar to the second embodiment. When both withdrawal pumps $P_3$ and the $P_4$ are operated in the afore-mentioned state, the suction force acts even on the blood $D_2$ in the second channel $B_2$ through air in the sealed containers $L_1$ and $L_2$→the buffer solution $D_1$ in the fifth channel $B_5$ and the fourth channel $B_4$→the buffer solution $D_1$ in the third channel $B_3$. If the valve is opened and the pressurized amount by the pressure pump $P_1$ is reduced up to some constant one, the buffer solution $D_1$ in both channels $B_4$ and $B_5$, and the buffer solution $D_1$ in the third channel $B_3$ are ejected into the containers $L_1$ and $L_2$. With such an ejection, the blood $D_2$ is supplied from the second channel $B_2$ to the third channel $B_3$, and flows, forming a layer. Thereafter, the blood $D_2$ is ejected from the fifth channel $B_5$ into the container $L_1$. The layer width $W_1$ of the buffer solution $D_1$ and the layer width $W_2$ of the blood $D_2$ can be changed by adjusting the suction amount of the blood $D_2$ by the first withdrawal pump $P_3$ and suction amount of the buffer solution $D_1$ by the second withdrawal pump $P_4$. Otherwise, the channel width of the buffer solution $D_1$ flowing in the first channel $B_1$, the third channel $B_3$ and the fourth channel $B_4$ may be adjusted with both withdrawal pump $P_3$ and the pressure pump $P_1$ by simultaneously operating the pressure pump $P_1$ with the withdrawal pumps $P_3$ and $P_4$.

The present invention has been explained on the basis of the example embodiments discussed. Although some variations have been mentioned, the embodiments which are described in the specification are illustrative and not limiting. The scope of the invention is designated by the accompanying claims and is not restricted by the descriptions of the specific embodiments. Accordingly, all the transformations and changes within the scope of the claims are to be construed as included in the scope of the present invention.

The invention claimed is:

1. A micro chip device, comprising:

a first channel wherein buffer solution flows;

a second channel wherein blood flows;

a third channel connected with a downstream of said first and second channels wherein said buffer solution and said blood flow, forming layers having a longitudinal interface between said buffer solution and said blood;

first solution supply means for controlling supply amount of said buffer solution;

second solution supply means for controlling supply amount of said blood;

a reaction portion located at said third channel which does not react to said buffer solution but reacts to said blood;

wherein said longitudinal interface between said buffer solution and said blood laterally moves in said third channel according to a control of supply amount of said buffer solution by said first solution supply means and a control of supply amount of said blood by said second solution supply means;

said reaction portion being an area coated with a coagulant, said coagulant does not react to said buffer solution but reacts to said blood so as to aggregate platelets; and said reaction portion being located at a wall face of said third channel which contacts said laterally moving interface.

2. The micro chip device according to claim 1, wherein sections of said first through third channels have almost rectangular shapes.

3. A micro chip device comprising:

a first channel fluidly coupled to a source of a buffer solution;

a second channel fluidly coupled to a source of blood;

a third channel formed by convergence of said first and second channels, the first and second channels oriented so that said buffer solution and said blood flow through said third channel as layers having a longitudinal interface;

the third channel comprising a wall having first transverse section comprising a coagulant that reacts with said blood to aggregate platelets and a second transverse section that is free of said coagulant, said coagulant being non-reactive with respect to said buffer solution; and wherein said longitudinal interface is in contact with said wall.

4. The microchip device according to claim 3 wherein said first transverse section is coated with said coagulant.

5. The microchip device according to claim 3 wherein said wall comprises a longitudinal center line, the first transverse section located on only one side of the longitudinal center line.

6. The microchip device according to claim 5 further comprising:

means for controlling a supply amount of said buffer solution;

means for controlling a supply amount of said blood; and wherein said longitudinal interface between said buffer solution and said blood is transversely moved within said third channel so as to contact said first transverse section by manipulating said supply amount of said blood and/or said buffer solution.

7. The microchip device according to claim 3 further comprising:

said first channel, said second channel and said third channel having the same height.

8. The microchip device according to claim 3 further comprising:

the third channel having a generally rectangular transverse cross-section; and the wall being a roof of said rectangular transverse cross-section.

9. The microchip device according to claim 3 further comprising:

said first transverse section being an area coated with said coagulant; and said area coated with said coagulant being offset from a longitudinal center line of the wall.

10. A micro chip device, comprising:

a first channel through which a first solution flows;

a second channel through which a second solution flows;

a third channel connected downstream of said first and second channels wherein said first solution and said second solution flow as separate longitudinal layers having a fluid interface;

said third channel comprising a transverse section comprising a reactive agent, said reactive agent being non-reactive with respect to said first solution but reactive with respect to said second solution; and means for transversely moving said fluid interface within said third channel so that said second solution comes in and out of contact with said reactive agent.

11. The microchip device according to claim 10 wherein said first solution is a buffer solution and said second solution is blood, and wherein said reactive agent is a coagulant.

12. The microchip device according to claim 10 wherein said reactive agent is a drug.

13. The microchip device according to claim 10 further comprising:

means for controlling a supply amount of said first solution;

means for controlling a supply amount of said second solution; and wherein said longitudinal interface is transversely moved within said third channel by manipulating said supply amount of said blood and/or said buffer solution.

14. The microchip device according to claim 10 wherein said first solution is a buffer solution and said second solution is blood.

15. The microchip device according to claim 10, further comprising:

the third channel having a generally rectangular transverse cross-section; and the wall being a roof of said rectangular transverse cross-section.

* * * * *